(12) United States Patent
Takizawa

(10) Patent No.: US 9,119,301 B2
(45) Date of Patent: *Aug. 25, 2015

(54) WIRING SUBSTRATE

(71) Applicant: SHINKO ELECTRIC INDUSTRIES CO., LTD., Nagano-ken (JP)

(72) Inventor: Daisuke Takizawa, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 230 days.

This patent is subject to a terminal disclaimer.

(21) Appl. No.: 14/018,644

(22) Filed: Sep. 5, 2013

(65) Prior Publication Data

US 2014/0083749 A1  Mar. 27, 2014

(30) Foreign Application Priority Data

Sep. 24, 2012  (JP) ................ 2012-209735

(51) Int. Cl.
| | | |
|---|---|---|
| H05K 1/18 | (2006.01) | |
| H05K 1/16 | (2006.01) | |
| H05K 7/00 | (2006.01) | |
| H05K 1/02 | (2006.01) | |
| H01L 23/498 | (2006.01) | |
| H05K 3/46 | (2006.01) | |
| H01L 23/50 | (2006.01) | |
| H05K 3/00 | (2006.01) | |
| H05K 3/30 | (2006.01) | |

(52) U.S. Cl.
CPC ........ *H05K 1/0271* (2013.01); *H01L 23/49822* (2013.01); *H01L 23/50* (2013.01); *H05K 3/4602* (2013.01); *H01L 23/49827* (2013.01); *H01L 2224/16225* (2013.01); *H05K 1/185* (2013.01); *H05K 3/005* (2013.01); *H05K 3/0026* (2013.01); *H05K 3/303* (2013.01); *H05K 2201/0187* (2013.01); *H05K 2201/09072* (2013.01); *H05K 2201/09854* (2013.01); *H05K 2201/10636* (2013.01)

(58) Field of Classification Search
CPC ....... H05K 1/183; H05K 1/188; H05K 3/325; H05K 3/326; H05K 1/184
USPC .......................... 174/260; 361/760, 761, 763
See application file for complete search history.

(56) References Cited

U.S. PATENT DOCUMENTS

| | | | | |
|---|---|---|---|---|
| 7,876,577 | B2 * | 1/2011 | Weber et al. .................. | 361/807 |
| 2008/0136013 | A1 * | 6/2008 | Kamiya et al. ................ | 257/700 |

FOREIGN PATENT DOCUMENTS

JP  2007-258541  10/2007

\* cited by examiner

*Primary Examiner* — Sherman Ng
(74) *Attorney, Agent, or Firm* — Fish & Richardson P.C.

(57) ABSTRACT

A wiring substrate is provided with a substrate core including a first main surface, a second main surface, and a through hole. An electronic component is arranged in the through hole. A projection projects from a wall of the through hole toward a connection terminal of the electronic component. An insulator is filled between the wall of the through hole and the electronic component. A first insulation layer covers the electronic component and the first main surface. A second insulation layer covers the electronic component and the second main surface. The electronic component includes an electronic component body and the connection terminal formed on a side of the electronic component body. The connection terminal of the electronic component includes an engagement groove formed by the projection and extending along a direction in which the electronic component is fitted into the through hole.

10 Claims, 5 Drawing Sheets

WIRING SUBSTRATE

CROSS-REFERENCE TO RELATED APPLICATIONS

This application is based upon and claims the benefit of priority from prior Japanese Patent Application No. 2012-209735, filed on Sep. 24, 2012, the entire contents of which are incorporated herein by reference.

FIELD

The present disclosure relates to a wiring substrate.

BACKGROUND

Japanese Laid-Open Patent Publication No. 2007-258541 describes a wiring substrate incorporating electronic components such as chip capacitors. A wiring substrate includes a substrate core including a through hole. The through hole of the substrate core receives an electronic component. To manufacture the wiring substrate, a substrate core including a through hole that is larger than the electronic component is first prepared. A tape is first temporarily fastened to one side of the substrate core in order to seal the through hole. The electronic component is arranged in the through hole from the side that is not sealed by the tape. Under this situation, an insulation layer is formed on the surface of the substrate core that is free from the tape to fix the electronic components. Then, the tape is removed from the substrate core.

SUMMARY

When forming the insulation layer with the tape temporarily fastened to the substrate core, the pressure applied to the substrate core when forming the insulation layer results in the tape being rigidly fastened to the substrate core. Thus, when removing the tape from the substrate core, the adhesive agent of the tape may remain on the substrate core. The residual adhesive agent may cause warping of the wiring substrate or defoliation of the insulation layer from the substrate core. As a result, the wiring substrate may become defective.

One aspect of the present disclosure is a wiring substrate provided with a substrate core including a first main surface, a second main surface, and a through hole. An electronic component is arranged in the through hole. A projection projects from a wall of the through hole toward a connection terminal of the electronic component. An insulator is filled between the wall of the through hole and the electronic component. A first insulation layer covers the electronic component and the first main surface of the substrate core. A second insulation layer covers the electronic component and the second main surface of the substrate core. The electronic component includes an electronic component body and the connection terminal formed on a side of the electronic component body. The connection terminal of the electronic component includes an engagement groove formed by the projection and extending along a direction in which the electronic component is fitted into the through hole.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF EMBODIMENTS

One embodiment will now be described with reference to the drawings.

Elements in the accompanying drawings are illustrated for simplicity and clarity and have not necessarily been drawn to scale. Hatching lines may be removed from the cross-sectional views to facilitate understanding.

Figure 1A:
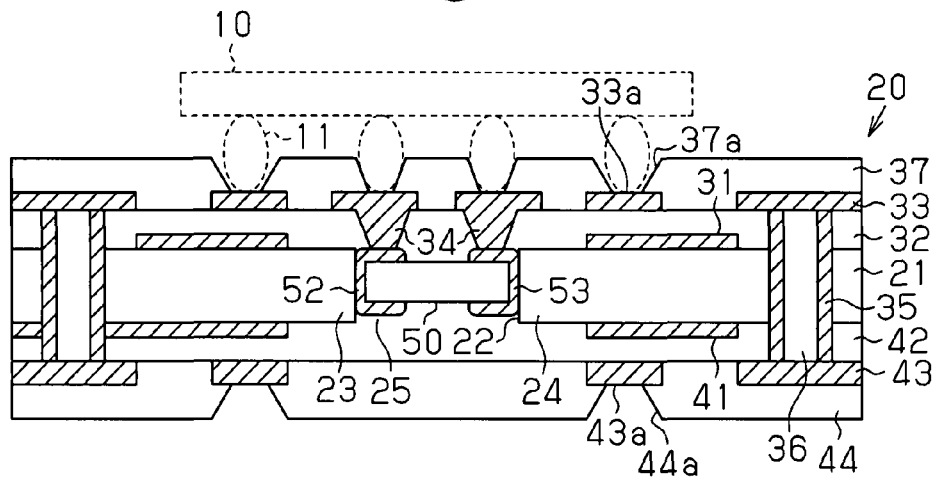
FIG. 1A is a cross-sectional view of a wiring substrate taken along line A-A in FIG. 1C.

Referring to FIG. 1A, an electronic device includes a semiconductor chip 10 and a wiring substrate 20. The semiconductor chip 10 is mounted on a first main surface (upper surface as viewed in the drawing) of the wiring substrate 20. The wiring substrate 20 is mounted on a substrate such as a motherboard. Further, the wiring substrate 20 may be used for a semiconductor package that supports chips such as a CPU.

The wiring substrate 20 includes a substrate core 21. The substrate core 21 may be, for example, a glass epoxy substrate formed by impregnating a glass cloth (glass fabric), which is an example of a reinforcement material, with a thermosetting insulative resin of which the main component is an epoxy resin. The reinforcement material is not limited to a glass cloth and may be, for example, a nonwoven glass fabric, an aramid fabric, an aramid nonwoven fabric, a liquid crystal polymer (LCP) fabric, or an LCP nonwoven fabric. The thermosetting insulative resin is not limited to epoxy resin and may be a resin material such as polyimide resin or cyanate resin.

A through hole 22 extends through the substrate core 21 from the upper surface (first main surface) to the lower surface (second main surface). Referring to FIG. 1C, the through hole 22 is tetragonal as viewed from above. FIG. 1C illustrates a tetragonal portion of the substrate core 21 where the through hole 22 is formed.

A chip capacitor 50 is arranged in the through hole 22. The chip capacitor 50 is one example of an electronic component. The chip capacitor 50 includes a box-shaped capacitor body 51 (electronic component body) and two connection terminals 52 and 53 formed on the two longitudinal ends of the capacitor body 51. The capacitor body 51 is formed by, for example, an electrode of mainly ceramic and copper. The material of the connection terminals 52 and 53 is, for example, copper. The connection terminals 52 and 53 are formed to cover the longitudinal end surfaces and side surfaces of the capacitor body 51. The connection terminals 52 and 53 have a thickness of, for example, 50 μm.

Figure 3A:
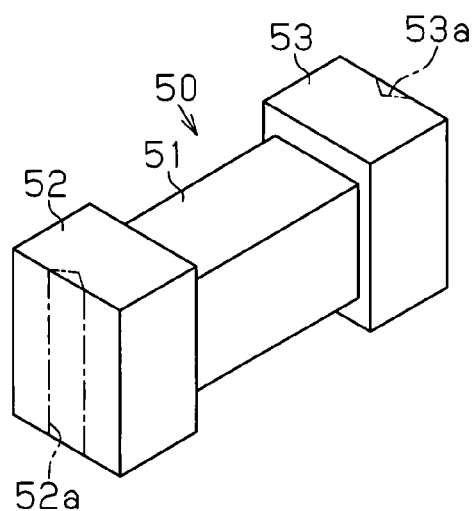
FIGS. 3A and 3B are respectively a perspective view and a side view of the chip capacitor.

The substrate core 21 includes projections 23 and 24 facing the two end surfaces of the chip capacitor 50 in the through hole 22. In the illustrated example, each of the projections 23 and 24 is a triangular prism that includes a base defined by the corresponding short side of the tetragonal through hole 22. The projections 23 and 24 project toward the corresponding connection terminals 52 and 53 to sandwich the chip capacitor 50. The size of the projections 23 and 24 is set so that the distance between the tips of the projections 23 and 24 is shorter than the length of the chip capacitor 50 and longer than the length of the capacitor body 51. The projections 23 and 24 are formed from the same material of the substrate core 21, that is, a hardened resin with a reinforcement material (e.g., a glass cloth). This results in the tips of the projections 23 and 24 biting into the connection terminals 52 and 53 of the chip capacitor 50. Thus, the projections 23 and 24 support the chip capacitor 50 in the through hole 22. When arranging the chip capacitor 50 in the through hole 22, the projections 23 and 24 form engagement grooves 52a and 53a in the connection terminals 52 and 53, respectively. Accordingly, the engagement grooves 52a and 53a are shaped in close conformance to the corresponding projections 23 and 24. In FIG. 3A, the broken lines indicates where the engagement grooves 52a and 53a are formed. Since the tips of the projections 23 and 24 do not reach the capacitor body 51, the projections 23 and 24 do not damage the capacitor body 51.

Figure 2:
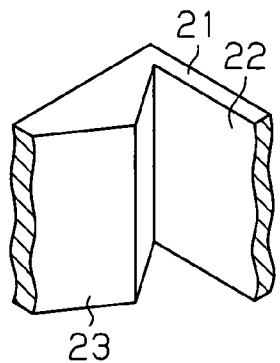
FIG. 2 is a perspective view illustrating a projection that projects into the through hole from a wall of the through hole.
Figure 3B:
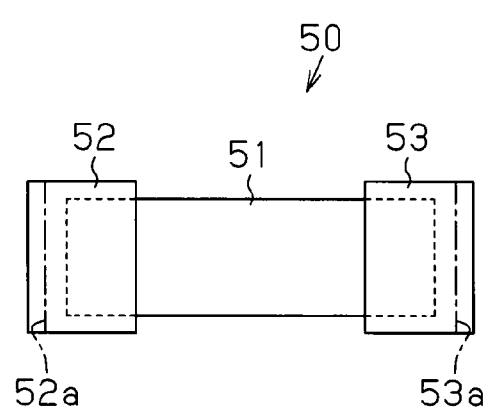

As illustrated in FIG. 2, the tip of the projection 23 is in the through hole 22 and the tip extends continuously in the thickness-wise direction of the substrate core 21. FIG. 2 is a perspective cross-sectional view illustrating the tetragonal portion of the substrate core 21 where the through hole 22 is formed. Although not illustrated in the drawings, in the same manner as the projection 23, in the through hole 22, the projection 24 is formed so that the tip extends continuously in the thickness-wise direction of the substrate core 21. Accordingly, as illustrated in FIGS. 3A and 3B, the projections 23 and 24 form straight engagement grooves 52a and 53a in the connection terminals 52 and 53 of the chip capacitor 50. This suppresses rotation of the chip capacitor 50. The projections 23 and 24 are examples of a peaked and elongated projection.

Figure 1B:
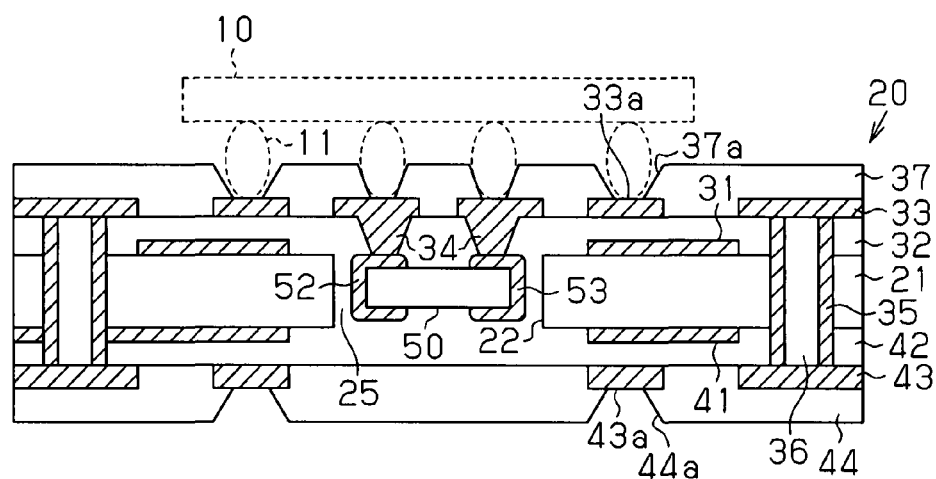
FIG. 1B is a cross-sectional view of the wiring substrate taken along line B-B in FIG. 1C.
Figure 1C:
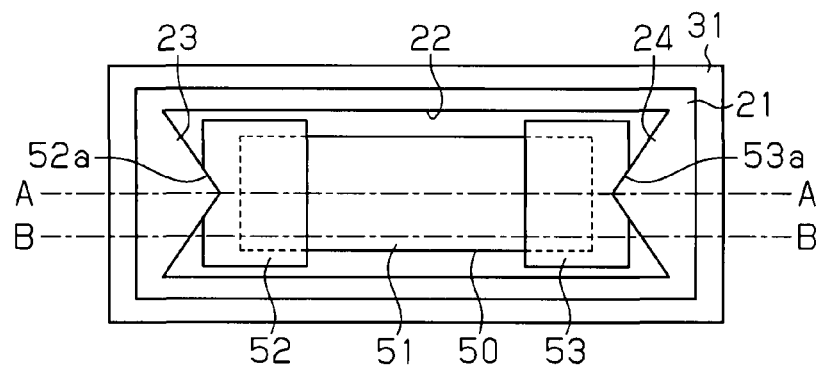
FIG. 1C is a schematic plan view illustrating a chip capacitor fixed in a through hole of the wiring substrate.

Referring to FIG. 1B, an insulator 25 fills the through hole 22. The insulator 25 is formed by filling the through hole 22 with a resin and then hardening the resin. The resin has a viscosity allowing for the resin to fill the through hole 22. The resin used for the insulator 25 may be, for example, an epoxy resin, a polyimide resin, or an acrylic resin.

As illustrated in FIGS. 1A and 1B, a wiring layer 31, an insulation layer 32, and a wiring layer 33 are sequentially formed on the upper surface of the substrate core 21. In the same manner, a wiring layer 41, an insulation layer 42, and a wiring layer 43 are sequentially formed on the lower surface of the substrate core 21. The wiring layers 31, 33, 41, and 43 are formed from, for example, copper. The insulation layers 32 and 42 are formed from an epoxy resin, a polyimide resin, an acrylic resin, or the like. Vias 34 extending through the insulation layer 32 connect portions of the pattern of the wiring layer 31 to the connection terminals 52 and 53 of the chip capacitor 50. Through holes 35 extending through the substrate core 21 and the insulation layers 32 and 42 connect portions of the patterns of the wiring layers 31, 33, 41, and 43 to one another. The through holes 35 are tubular and filled with an insulator 36. The insulator 36 is formed by filling each through hole 35 with a resin and then hardening the resin. The resin has a viscosity allowing for the resin to fill the through hole 35. The resin used for the insulator 36 may be, for example, an epoxy resin, a polyimide resin, or an acrylic resin. Although not illustrated in the drawings, vias extending through the insulation layer 32 connect portions of the patterns of the wiring layers 31 and 33, and vias extending through the insulation layer 42 connect portions of the patterns of the wiring layers 41 and 43. Through electrodes may be formed in the substrate core 21 to electrically connect the wiring layers 31 and 41 that are formed on the two opposite surfaces of the substrate core 21.

A resist film 37 covers the insulation layer 32 and the wiring layer 33. The resist film 37 includes openings 37a that expose portions of the wiring layer 33 as connection pads 33a. In the same manner, a resist film 44 covers the insulation layer 42 and the wiring layer 43. The resist film 44 includes openings 44a that expose portions of the wiring layer 43 as connection pads 43a.

As illustrated in FIG. 1A, bumps 11 of a semiconductor chip 10 are connected to the pads 33a. Accordingly, the bumps 11, the pads 33a (wiring layer 33), and the vias 34 connect the semiconductor chip 10 to the chip capacitor 50. Although not illustrated in the drawings, the pads 43a are connected by bumps (solder balls or the like) to a substrate such as a motherboard.

A method for manufacturing the wiring substrate 20 will now be described.

Figure 4:
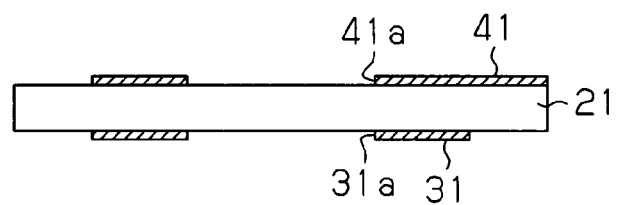
FIG. 4 is a cross-sectional view illustrating a manufacturing process of the wiring substrate.

As illustrated in FIG. 4, metal foils on the two opposite surfaces of the substrate core 21 are patterned by, for example, etching or the like to form the wiring layers 31 and 41. Here, openings 31a and 41a may be formed in the wiring layers 31 and 41 in accordance with a location and size of the through hole 22 of FIG. 1A which is formed later.

Figure 5A:
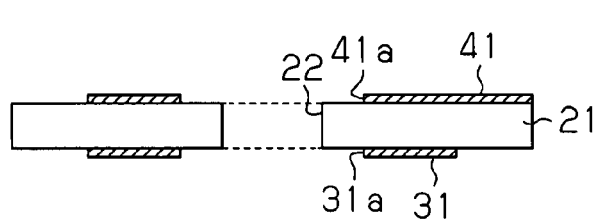
FIGS. 5A and 5B are respectively a cross-sectional view and a partial plan view illustrating a manufacturing process of the wiring substrate.
Figure 5B:
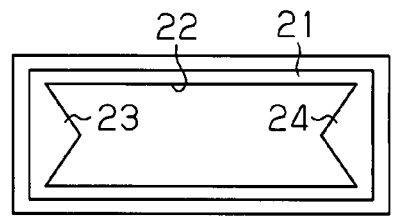

Referring to FIGS. 5A and 5B, the projections 23 and 24 are formed in the substrate core 21. A pressing machine or a laser processing machine, for example, may be used to form the through hole 22 and the projections 23 and 24.

Figure 6A:
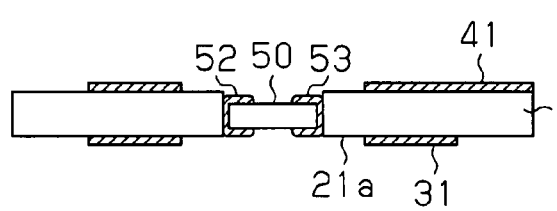
FIGS. 6A and 6B are respectively a cross-sectional view and a partial plan view illustrating a manufacturing process of the wiring substrate.
Figure 6B:
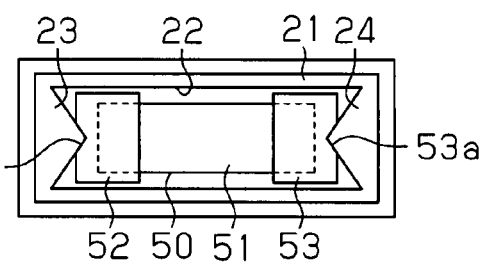

Referring to FIGS. 6A and 6B, the chip capacitor 50 is fitted into the through hole 22 of the substrate core 21. Here, the substrate core 21 is set on a jig that includes a flat reference surface, and the chip capacitor 50 is forced against the reference surface when fitted into the through hole 22. This allows the chip capacitor 50 to be supported by the projections 23 and 24 in a level state. As a result, the chip capacitor 50 may be arranged so that main surfaces of the connection terminals 52 and 53 of the chip capacitor 50 (i.e., exposed surfaces of the chip capacitor 50 in the through hole 22) are parallel to (generally flush with) one main surface 21a (lower surface as viewed in the drawing) of the substrate core 21.

Figure 7:
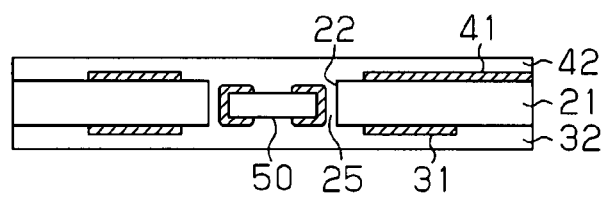
FIG. 7 is a cross-sectional view illustrating a manufacturing process of the wiring substrate.

Then, referring to FIG. 7, the insulation layers 32 and 42 are formed on the two opposite surfaces of the substrate core 21. For example, the substrate core 21 and the upper and lower surfaces of the chip capacitor 50 are each covered by a resin film. The resin film may be formed from a thermosetting resin. Further, the resin film may be in, for example, a semi-cured state (B-stage state). The resin films are pressed against the substrate core 21 by a pressing machine or the like under a depressurized atmosphere by a pressing machine or the like to fill the space between the walls of the through hole 22 and the chip capacitor 50 with resin. Engagement of the engagement grooves 52a and 53a, which are formed in the connection terminals 52 and 53 when coming into contact with the projections 23 and 24, which include tips extending continuously in the thickness-wise direction of the substrate core 21 (refer to FIG. 2), holds the chip capacitor 50 in the through hole 22. Thus, the chip capacitor 50 is not displaced even when pressure for charging resin into the through hole 22 is applied to the chip capacitor 50. This suppresses rotation or the like of the chip capacitor 50. The resin is heated and hardened to form the insulator 25 and the insulation layers 32 and 42 illustrated in FIG. 1B.

Figure 8:
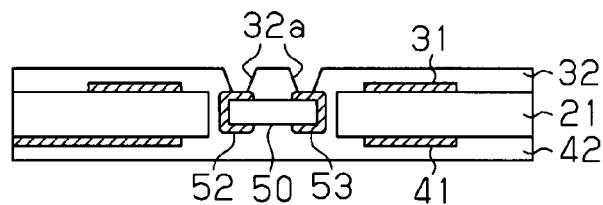
FIG. 8 is a cross-sectional view illustrating a manufacturing process of the wiring substrate.

Then, referring to FIG. 8, openings 32a are formed in the insulation layer 32 to expose portions of the connection terminals 52 and 53 of the chip capacitor 50. In FIG. 8, the structure obtained in FIG. 7 is reversed upside-down. A laser processing machine of the like is used to form the openings 32a. Here, the main surfaces of the connection terminals 52 and 53 of the chip capacitor 50 are generally flush with the main surface 21a of the substrate core 21. This reduces differences in the thickness of the insulation layer 32 covering the connection terminals 52 and 53 from the desired thickness (e.g., designed value). Thus, exposure of the main surfaces of the connection terminals 52 and 53 is ensured, and connection with the vias 34 (refer to FIG. 1A) that are formed next is ensured. The main surfaces of the connection terminals 52 and 53 of the chip capacitor 50 may be generally flush with the wiring layer 31 formed on the substrate core 21. In this case, exposure of the main surfaces of the connection terminals 52 and 53 is ensured in the same manner.

Although not illustrated in the drawings, the vias 34 and the wiring layers 33 and 43 are formed through, for example, a semi-additive process or an additive process. In one example, the through hole 35 is formed by performing electroless copper plating or electrolytic copper plating on a through hole formed by a laser processing machine or a drilling machine. In one example, a photosensitive film is patterned into a film having a predetermined shape to form the resist films 37 and 44.

The operation of the wiring substrate 20 will now be described.

When manufacturing the wiring substrate 20, the projections 23 and 24 on the walls of the through hole 22 support the chip capacitor 50. Thus, there is no need for a tape that tentatively holds the chip capacitor 50 in the through hole 22. Accordingly, an adhesive agent of such a tape does not remain on the two opposite surfaces of the substrate core 21. Further, warping of the wiring substrate 20 or defoliation of the insulation layers 32 and 42 that would be caused by residual adhesive agent may be suppressed.

The projections 23 and 24 are formed on the walls facing the connection terminals 52 and 53 of the chip capacitor 50 in the through hole 22. Accordingly, the capacitor body 51 of the chip capacitor 50 does not come into engagement with the projections 23 and 24. As a result, stress or the like is not applied when the capacitor body 51 is supported. This suppresses damages such as cracking of the capacitor body 51.

The distance between the tips of the projections 23 and 24 is set to be shorter than the length of the chip capacitor 50. This allows the tips of the projections 23 and 24 to bite into the connection terminals 52 and 53 of the chip capacitor 50 and to form the straight engagement grooves 52a and 53a in the connection terminals 52 and 53. Engagement of the engagement grooves 52a and 53a with the projections 23 and 24, which include tips extending continuously in the thickness-wise direction of the substrate core 21, suppresses rotation of the chip capacitor 50. By suppressing rotation of the chip capacitor 50 that would cause connection failures of the vias 34 corresponding to the connection terminals 52 and 53, connection failures of the vias 34 to the connection terminals 52 and 53 is reduced.

The present embodiment has the advantages described below.

(1) The substrate core 21 includes the through hole 22 that receives the chip capacitor 50. The projections 23 and 24 formed on the walls of the through hole 22 support the chip capacitor 50. Accordingly, there is no need for tape to temporarily hold the chip capacitor 50 in the through hole 22. Thus, warping of the wiring substrate 20 or defoliation of the insulation layers 32 and 42 may be suppressed. This reduces defects in the wiring substrate 20.

(2) The projections 23 and 24 are formed in the through hole 22 on the walls facing the connection terminals 52 and 53 of the chip capacitor 50. This suppresses damage to the capacitor body 51 of the chip capacitor 50 and reduces defects in the wiring substrate 20.

It should be apparent to those skilled in the art that the present invention may be embodied in many other specific forms without departing from the spirit or scope of the invention. Particularly, it should be understood that the present invention may be embodied in the following forms.

Figure 9A:
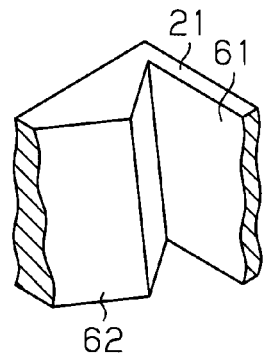
FIGS. 9A and 9B are perspective views illustrating projections that project into a through hole from a wall of the through hole in further modifications.
Figure 9B:
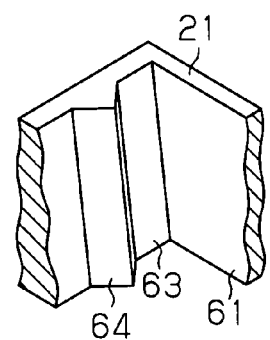

The shapes of the projections 23 and 24 may be changed. For example, as illustrated in FIG. 9A, a tapered through hole 61 may be formed. In this case, the distance between the tips of projections 62 formed on the walls of the through hole 61 may gradually shorten in a thickness-wise direction of the substrate core 21. This allows for the chip capacitor 50 to be easily fitted into the through hole 61. That is, the pressure applied to fit the chip capacitor 50 into the through hole 61 is decreased in comparison to when using a non-tapered through hole. This decreases the stress applied to the capacitor body 51 of the chip capacitor 50 and suppresses damage of the capacitor body 51. In this case, as illustrated in FIG. 9B, a wall 63 may include a portion forming a triangular projection 64 (triangular pillar).

Figure 10A:
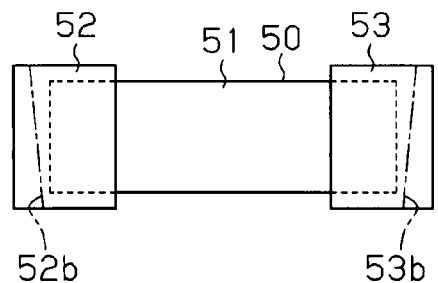
FIGS. 10A and 10B are side views illustrating chip capacitors in another modification.
Figure 10B:
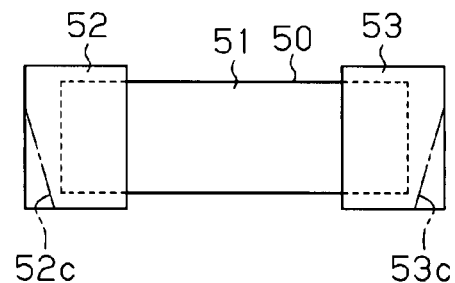

When the through hole 61 is tapered, as illustrated in FIG. 10A, the chip capacitor 50 may include engagement grooves 52b and 53b having depths that gradually vary in the thickness-wise direction of the substrate core 21. Further, the inclination of side surfaces may be changed. For example, as illustrated in FIG. 10B, a though hole may be formed so that engagement grooves 52c and 53c are formed in portions of the connection terminals 52 and 53. In the same manner as such embodiment, such engagement grooves 52c and 53c also suppress rotation of the chip capacitor 50.

In the chip capacitor 50, each of the connection terminals 52 and 53 may be thinner at a peripheral portion than a central portion. In this case, when forming a through hole including tapered walls with, for example, a pressing device, the open end of the through hole may be chamfered to avoid contact of the projections with the capacitor body 51 of the chip capacitor 50. The chamfering of the open end is performed at the same time as when the through hole 61 is formed with the pressing machine.

Although the projections 23 and 24 are formed to be triangular, as long as the chip capacitor 50 can be supported, the shapes of the projections may be changed. For example, arcuate or trapezoidal projections may be formed.

Figure 11A:
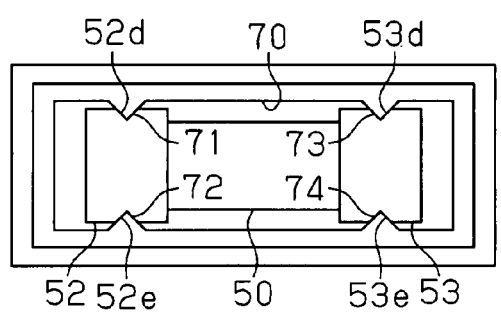
FIG. 11A is a schematic plan view illustrating a chip capacitor fixed in a through hole in a further modification.
Figure 11B:
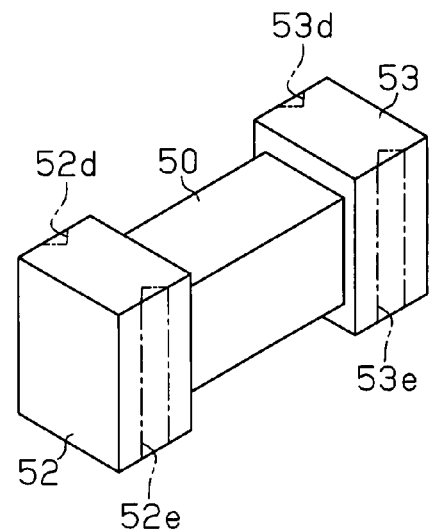
FIG. 11B is a perspective view of the chip capacitor illustrated in FIG. 11A.

The projections 23 and 24 are formed on the walls of the through hole 22 facing the connection terminals 52 and 53 on the end surfaces of the chip capacitor 50. However, the locations where the projections are formed may be changed. For example, as illustrated in FIG. 11A, a through hole 70 may include walls with projections 71 to 74 facing the connection terminals 52 and 53. In this case, as illustrated in FIG. 11B, the side surfaces of the chip capacitor 50 may include engagement grooves 52d, 52e, 53d, and 53e formed on the connection terminals 52 and 53 so that the projections 71 to 74 can support the chip capacitor 50. The broken lines in FIG. 11B illustrates the locations of the engagement grooves 52d, 52e, 53d, and 53e.

Figure 12A:
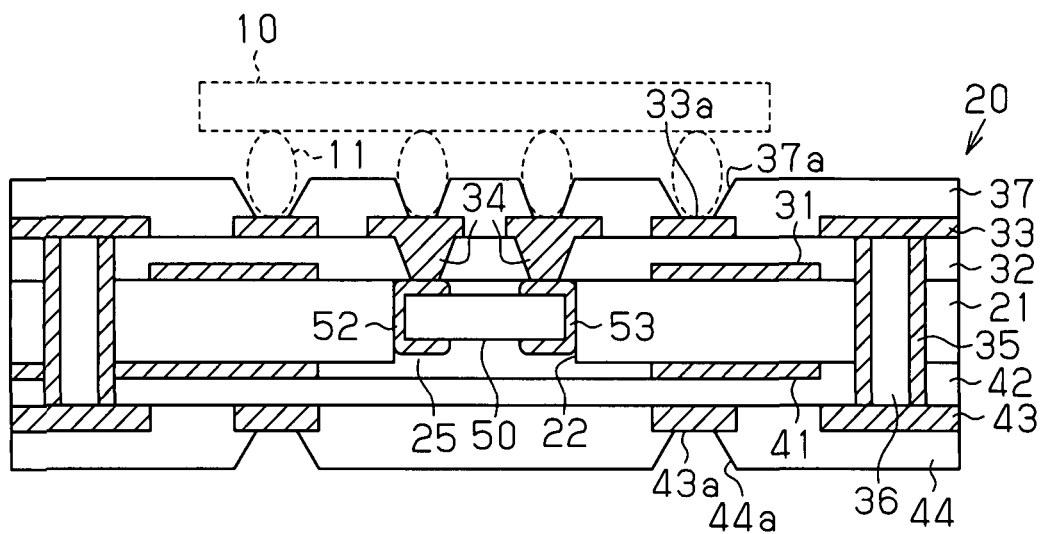
FIGS. 12A and 12B are cross-sectional views illustrating a wiring substrate in a further modification respectively taken at positions corresponding to FIGS. 1A and 1B.
Figure 12B:
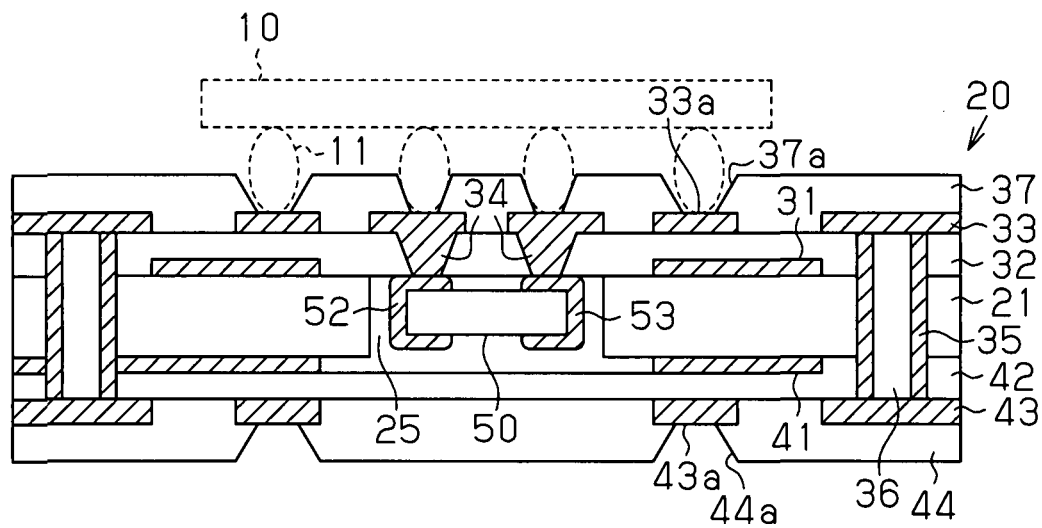

Referring to FIGS. 12A and 12B, the insulator 25 filled in the through hole 22 may be formed in a process that differs from the process in which the insulation layers 32 and 42 are formed. Further, the insulator 25 filling the through hole 22 may be formed from a resin that differs from that forming the insulation layers 32 and 42.

The number of wiring layers and insulation layers may be changed.

Each through hole 35 illustrated in FIG. 1A is filled with the insulator 36. Instead, the through hole 35 may be filled with a conductor (e.g., copper) to form a filled via through hole.

The through hole 22 formed in the substrate core 21 of the wiring substrate 20 receives the chip capacitor 50. Instead, the through hole 22 may receive a different electronic component such as a chip resistor, an inductor, or a semiconductor device (LSI).

The through hole 22 receives the chip capacitor 50 that includes the two connection terminals 52 and 53. Instead, the through hole 22 may receive an electronic component such as a capacitor that includes three or more connection terminals.

The connection terminals of a chip capacitor may be formed on the long sides of the capacitor body 51 that is box-shaped.

The disclosure further encompasses various example(s) described below.

[Clause 1] A method for manufacturing the wiring substrate, the method comprising:
preparing a substrate core including a through hole and a peaked and elongated projection that projects into the through hole;
fitting an electronic component into the through hole from one side of the substrate core with the peaked and elongated projection contacting a connection terminal of the electronic component, wherein the fitting an electronic component includes biting into the connection terminal with a tip of the peaked and elongated projection to form an elongated groove in the connection terminal, the elongated groove extending in the fitting direction of the electronic component; and
forming an insulation layer that fills the through hole and covers the electronic component.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A wiring substrate comprising:
a substrate core including a first main surface, a second main surface, and a through hole;
an electronic component arranged in the through hole;
a projection that projects from a wall of the through hole toward a connection terminal of the electronic component;
an insulator filled between the wall of the through hole and the electronic component;
a first insulation layer that covers the electronic component and the first main surface of the substrate core; and
a second insulation layer that covers the electronic component and the second main surface of the substrate core, wherein
the electronic component includes an electronic component body and the connection terminal formed on a side of the electronic component body, and
the connection terminal of the electronic component includes an engagement groove formed by the projection and extending along a direction in which the electronic component is fitted into the through hole.

2. The wiring substrate according to claim 1, wherein
the projection is one of a plurality of projections including two projections respectively formed on two opposing walls of the through hole, and
a distance between tips of the two projections formed on the two opposing walls of the through hole is set to be smaller than the dimension of a corresponding portion of the electronic component but larger than the dimension of a corresponding portion of the electronic component body.

3. The wiring substrate according to claim 1, wherein the projection extends continuously from the first main surface to the second main surface on the substrate core.

4. The wiring substrate according to claim 1, wherein
the projection includes a tip, and
the tip is formed so that a distance from the connection terminal of the electronic component gradually changes from the first surface toward the second surface of the substrate core.

5. The wiring substrate according to claim 1, wherein the substrate core includes a reinforcement material.

6. The wiring substrate according to claim 1, wherein
the insulator, the first insulation layer, and the second insulation layer are formed from the same thermosetting resin; and
the insulator is filled between the electronic component and the wall of the through hole when heating and pressurizing the first insulation layer and the second insulation layer.

7. A wiring substrate comprising:
a substrate core including a through hole and a peaked and elongated projection projecting into the through hole;
an electronic component fitted into the through hole from one side of the substrate core, wherein the electronic component includes a connection terminal engaged with the peaked and elongated projection; and
an insulation layer that fills the through hole and covers the electronic component,
wherein the peaked and elongated projection includes a tip that bits into the connection terminal to form an elongated groove that is in close conformance to the tip of the peaked and elongated projection.

8. The wiring substrate according to claim 7, wherein the peaked and elongated projection has a hardness that is sufficient for the tip of the peaked and elongated projection to bite into the connection terminal and form the elongated groove in the connection terminal when fitting the electronic component into the through hole.

9. The wiring substrate according to claim 7, wherein
the connection terminal is a conductive and relatively soft member, and
the peaked and elongated projection is a reinforced and hardened resin projection.

10. The wiring substrate according to claim 7, wherein
the electronic component includes a plurality of connection terminals,
the substrate core includes a plurality of peaked and elongated projections projecting into the through hole and engaged with the plurality of connection terminals, and
two of the plurality of peaked and elongated projections face each other to sandwich the electronic component.

\* \* \* \* \*